US012703176B2

(12) United States Patent
Matsumae et al.

(10) Patent No.: US 12,703,176 B2
(45) Date of Patent: Aug. 11, 2026

(54) COMPOSITE BODY COMPRISING SILICON CARBIDE AND METHOD FOR PRODUCING SAME

(71) Applicant: NATIONAL INSTITUTE OF ADVANCED INDUSTRIAL SCIENCE AND TECHNOLOGY, Tokyo (JP)

(72) Inventors: Takashi Matsumae, Tsukuba (JP); Hideki Takagi, Tsukuba (JP); Hitoshi Umezawa, Kawanishi (JP); Yuuichi Kurashima, Tsukuba (JP); Eiji Higurashi, Sendai (JP)

(73) Assignee: NATIONAL INSTITUTE OF ADVANCED INDUSTRIAL SCIENCE AND TECHNOLOGY (JP)

(*) Notice: Subject to any disclaimer, the term of this patent is extended or adjusted under 35 U.S.C. 154(b) by 180 days.

(21) Appl. No.: 18/550,096

(22) PCT Filed: Feb. 18, 2022

(86) PCT No.: PCT/JP2022/006549
§ 371 (c)(1),
(2) Date: Sep. 11, 2023

(87) PCT Pub. No.: WO2022/196241
PCT Pub. Date: Sep. 22, 2022

(65) Prior Publication Data

US 2024/0149565 A1 May 9, 2024

(30) Foreign Application Priority Data

Mar. 15, 2021 (JP) ................................ 2021-041360

(51) Int. Cl.
*B32B 18/00* (2006.01)
*H01L 23/373* (2006.01)
*H10W 40/25* (2026.01)

(52) U.S. Cl.
CPC .......... *B32B 18/00* (2013.01); *H10W 40/253* (2026.01)

(58) Field of Classification Search
None
See application file for complete search history.

(56) References Cited

U.S. PATENT DOCUMENTS

2021/0362380 A1* 11/2021 Liu .................. B29C 66/91935

FOREIGN PATENT DOCUMENTS

| JP | 2006-206377 A | 8/2006 |
|---|---|---|
| JP | 2009-117533 A | 5/2009 |

(Continued)

OTHER PUBLICATIONS

English translation of Izumi et al. (JP 2006-206377). (Year: 2006).*

(Continued)

*Primary Examiner* — Ronak C Patel
(74) *Attorney, Agent, or Firm* — OSTROLENK FABER LLP

(57) ABSTRACT

There is provided a silicon carbide composite body that can be expected to have efficient heat conduction and electrical conduction between bonding base materials. The silicon carbide composite body includes a first base material including silicon carbide having a silicon oxide layer $SiO_x$ formed on the surface and a second base material which has an oxide layer $MO_y$ with an element M, which is one or more of metals that forms an oxide in the atmosphere (excluding alkali metals and alkaline earth metals), Si, Ge, As, Se, Sb, and C in diamond on the surface, and is bonded to the first base material such that the $MO_y$ side faces the $SiO_x$ side, and (Continued)

when at least some of C in silicon carbide forms C—O-M bonds and/or at least some of Si in the silicon carbide forms Si—O-M bonds, the second base material is bonded to the first base material.

15 Claims, 11 Drawing Sheets

(56) References Cited

FOREIGN PATENT DOCUMENTS

| | | | |
|---|---|---|---|
| JP | 2014-003105 | A | 1/2014 |
| JP | 2014-209527 | A | 11/2014 |
| WO | WO 2020/230520 | A1 | 11/2020 |

OTHER PUBLICATIONS

English translation of Jiang et al. (CN 110444750). (Year: 2019).*
International Search Report mailed May 10, 2022 in corresponding PCT International Application No. PCT/JP2022/006549.
Jikai Xu et al., Fabrication of SiC/Si, SiC/SiO2, and SiC/glass heterostructures via VUV/$O_3$ activated direct bonding at low temperature, Ceramics International, 2019, 45(3), pp. 4094-4098.

* cited by examiner

FIG. 1

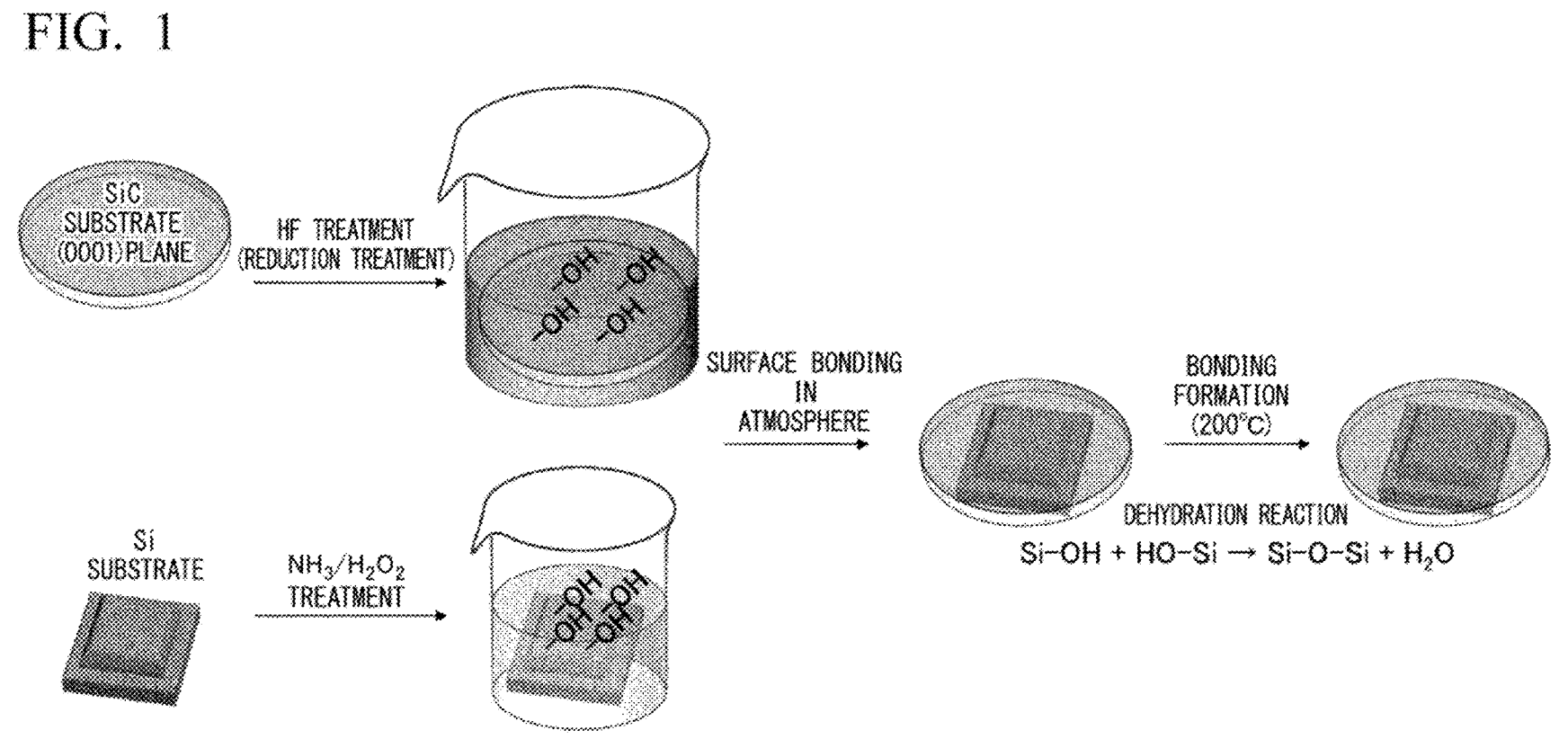

SiC SUBSTRATE (0001)PLANE

HF TREATMENT (REDUCTION TREATMENT)

HO- HO- HO- HO-

Si SUBSTRATE $NH_3/H_2O_2$ TREATMENT

HO HO HO HO

SURFACE BONDING IN ATMOSPHERE

BONDING FORMATION (200°C)

DEHYDRATION REACTION

Figure 3:
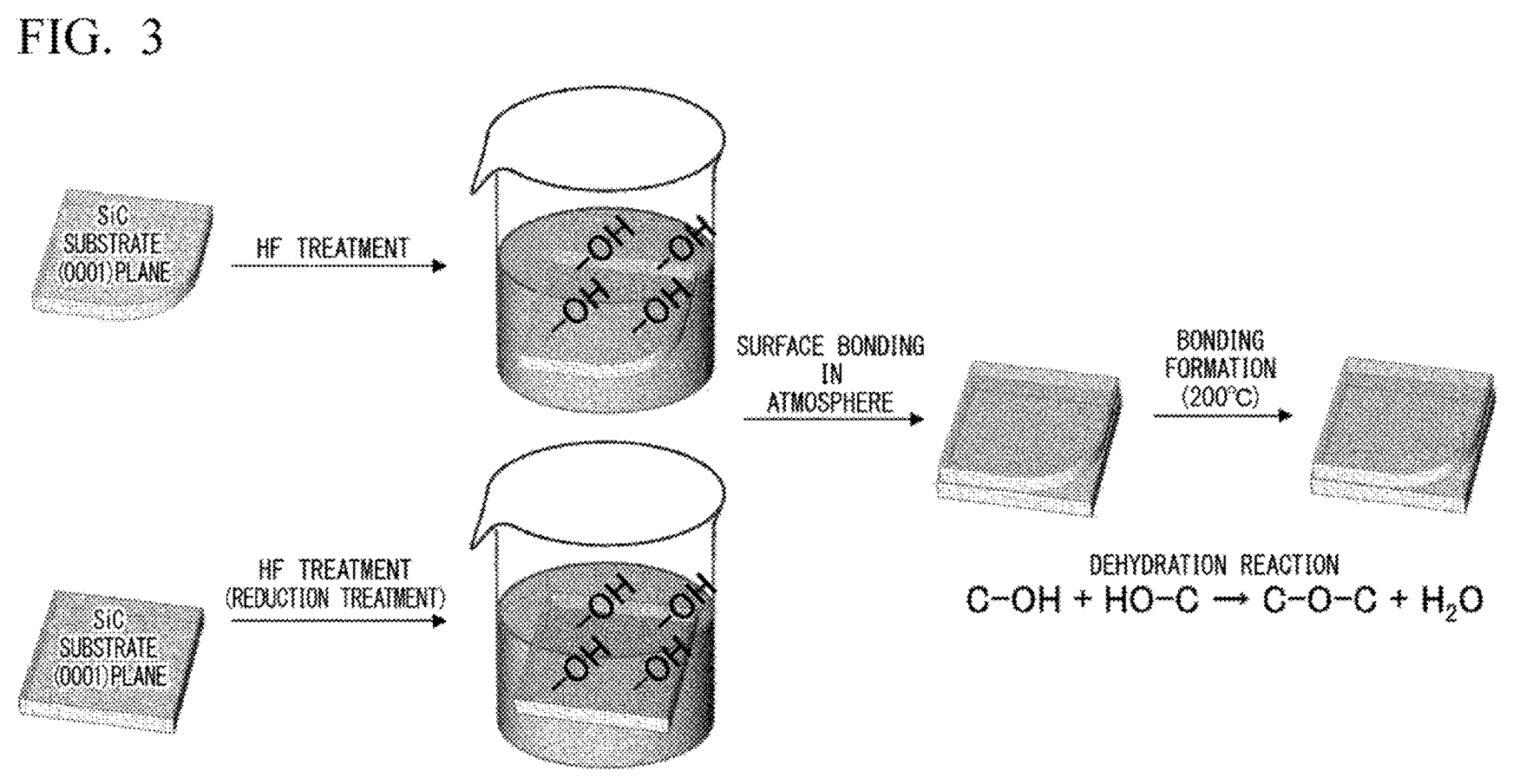

SiC SUBSTRATE (0001)PLANE

HF TREATMENT

HO-

SURFACE BONDING IN ATMOSPHERE

BONDING FORMATION (200°C)

DEHYDRATION REACTION $C\text{–}OH + HO\text{–}C \rightarrow C\text{–}O\text{–}C + H_2O$ SiC SUBSTRATE (0001)PLANE

HF TREATMENT (REDUCTION TREATMENT)

Figure 6:
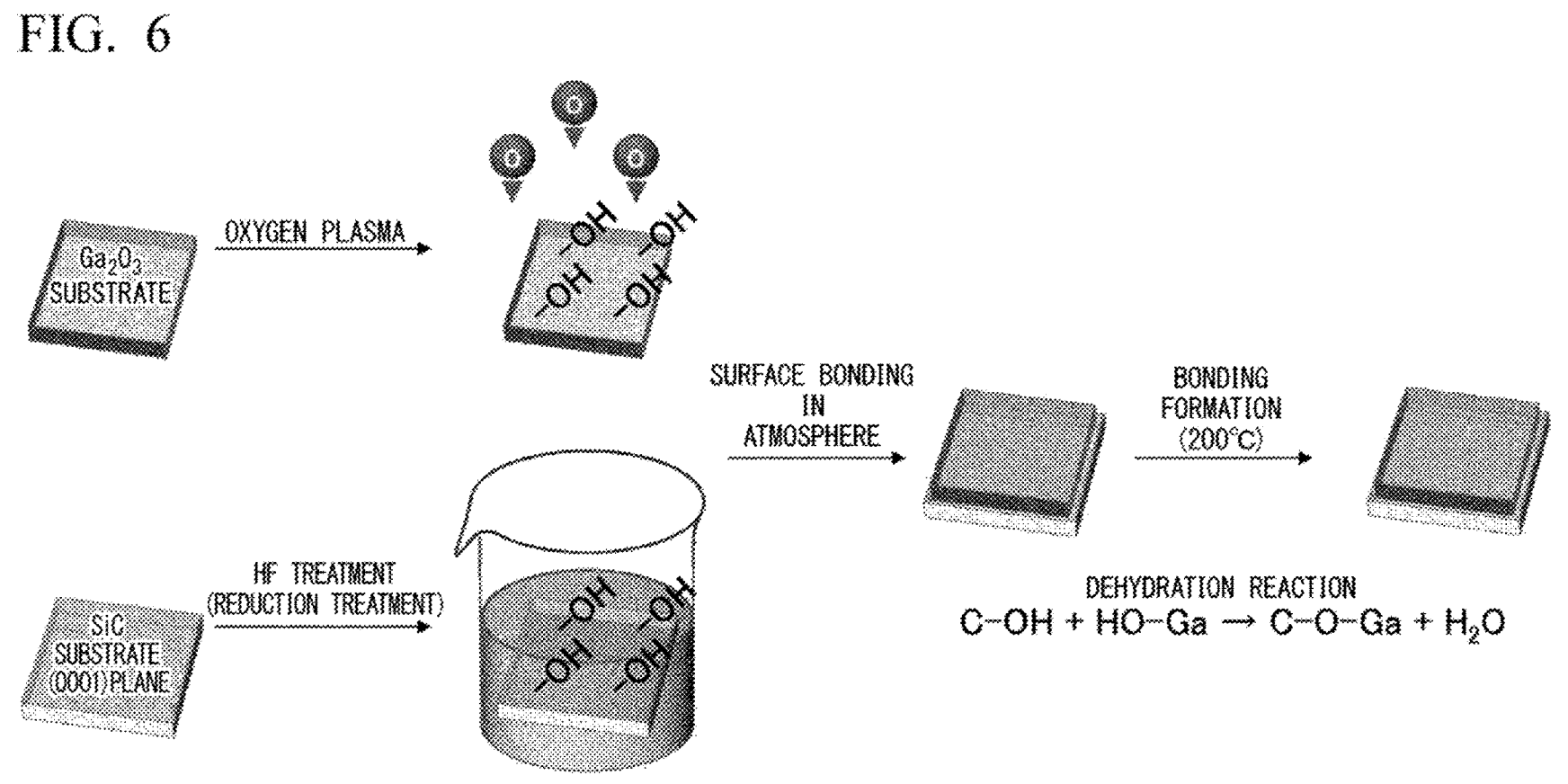

$Ga_2O_3$ SUBSTRATE

OXYGEN PLASMA

HO– HO– HO– HO–

SiC SUBSTRATE (001) PLANE

HF TREATMENT (REDUCTION TREATMENT)

HO– HO– HO– HO–

SURFACE BONDING IN ATMOSPHERE

BONDING FORMATION (200°C)

DEHYDRATION REACTION

Figure 8:
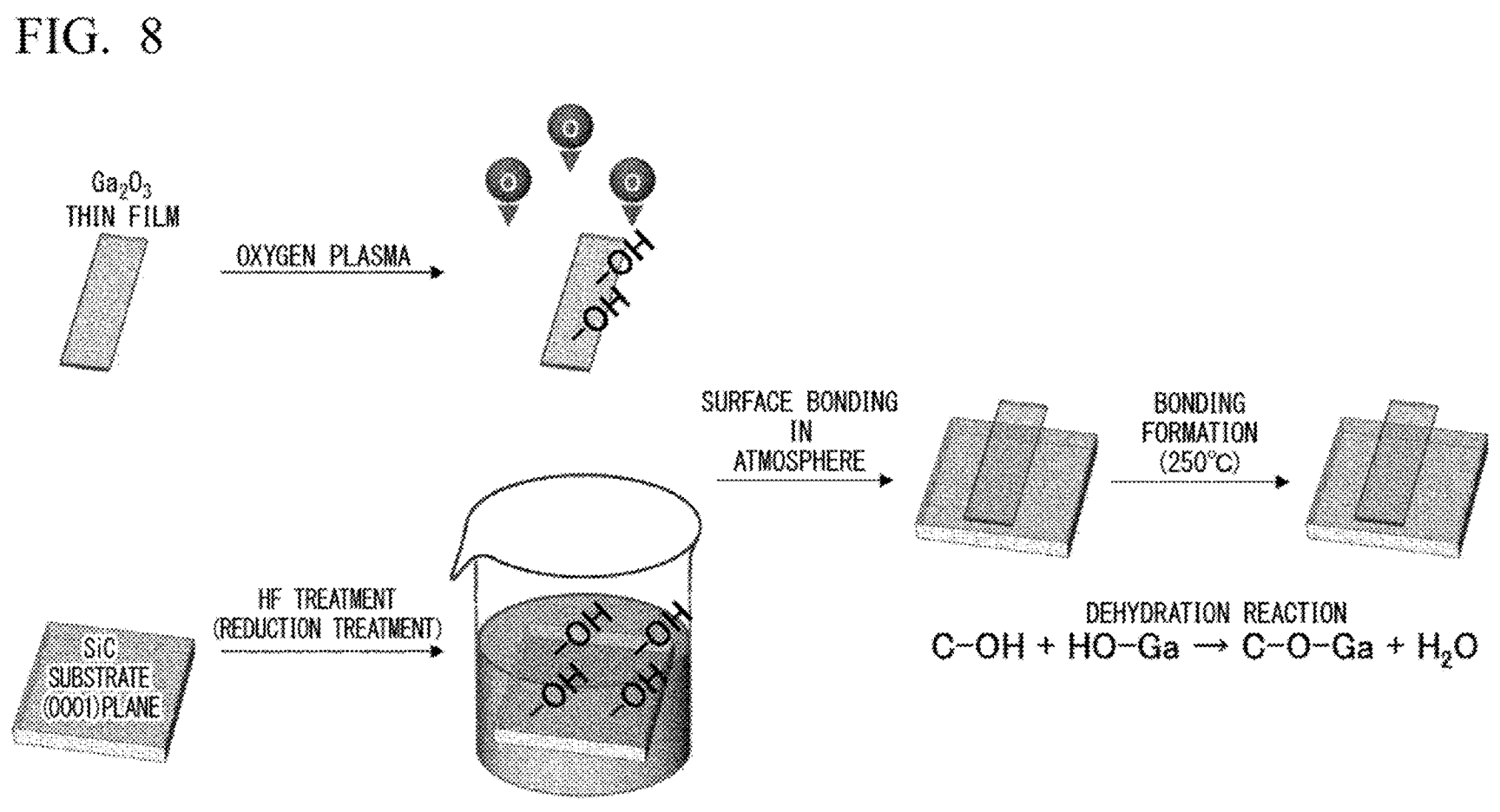

$Ga_2O_3$ THIN FILM

OXYGEN PLASMA

HO– HO–

SiC SUBSTRATE (0001)PLANE

HF TREATMENT (REDUCTION TREATMENT)

HO– HO– HO– HO–

SURFACE BONDING IN ATMOSPHERE

BONDING FORMATION (250°C)

DEHYDRATION REACTION

C–OH + HO–Ga → C–O–Ga + $H_2O$

COMPOSITE BODY COMPRISING SILICON CARBIDE AND METHOD FOR PRODUCING SAME

CROSS-REFERENCE TO RELATED APPLICATIONS

The present application is a 35 U.S.C. §§ 371 national stage application of International Application No. PCT/JP2022/006549, filed Feb. 18, 2022, which claims priority to Japanese Patent Application No. 2021-041360, filed Mar. 15, 2021, the contents of which are incorporated herein by reference.

TECHNICAL FIELD

The present invention relates to a composite body in which a plurality of base materials including a base material containing silicon carbide are bonded and a method for producing the same.

BACKGROUND ART

Silicon carbide substrates are used as substrates for heat dissipation or insulation of semiconductor devices. Silicon carbide substrates are often used by being bonded to other substrates such as other silicon carbide substrates or silicon substrates. A method for bonding a silicon substrate and a silicon carbide substrate at a relatively low temperature in the atmosphere using an oxidation treatment is known (Non-Patent Document 1). In this method, according to an oxidation treatment such as an oxygen plasma treatment, the surface oxide layer of the silicon substrate and the surface oxide layer of the silicon carbide substrate are OH-modified, the OH-modified surfaces are superimposed, and heated at about 200° C. to cause a dehydration reaction, and thus the silicon substrate and the silicon carbide substrate are bonded.

According to this method, without applying a special bonding load, the silicon substrate and the silicon carbide substrate can be bonded in the atmosphere. In addition, since the bonding temperature is a relatively low temperature at about 200° C., a silicon carbide substrate and a dissimilar substrate having a coefficient of thermal expansion close to a coefficient of thermal expansion of silicon carbide can be directly bonded. However, a silicon oxide layer with a thickness of about 4 nm to 9 nm is present at the bonding interface of the silicon-silicon carbide bonded substrate obtained by this method. This silicon oxide layer leads to reduced thermal conductivity and electrical conductivity between the bonded substrates.

CITATION LIST

Non-Patent Document

[Non-Patent Document 1]

Xu, J., Wang, C., Li, D., Cheng, J., Wang, Y, Hang, C., & Tian, Y, Fabrication of SiC/Si, SiC/SiO2, and SiC/glass heterostructures via VUV/O3 activated direct bonding at low temperature, Ceramics International, 2019, 45(3), p. 4094-4098

SUMMARY OF INVENTION

Technical Problem

An object of the present invention is to provide a composite body that can be expected to have efficient heat conduction and electrical conduction between bonding base materials, and a method for easily producing the composite body.

Solution to Problem

A silicon carbide composite body according to an aspect of the present invention includes a first base material including silicon carbide on at least a part of an upper surface and a second base material including an element M which is one or more of metal elements (excluding alkali metals and alkaline earth metals), Si, Ge, As, Se, Sb, C in diamond, and C in silicon carbide on at least a part of a lower surface, wherein the upper surface of the first base material and the lower surface of the second base material are bonded by C—O-M bonding between at least some of C in silicon carbide on the upper surface of the first base material and at least some of M on the lower surface of the second base material.

A silicon carbide composite body according to another aspect of the present invention includes a first base material including silicon carbide on at least a part of an upper surface and a second base material including an element M which is one or more of metal elements (excluding alkali metals and alkaline earth metals), Si, Ge, As, Se, Sb, C in diamond, and C in silicon carbide on at least a part of a lower surface, wherein the upper surface of the first base material and the lower surface of the second base material are bonded by Si—O-M bonding between at least some of Si in silicon carbide on the upper surface of the first base material and at least some of M on the lower surface of the second base material form.

A silicon carbide composite body according to still another aspect of the present invention includes a first base material including silicon carbide on at least a part of an upper surface, an intermediate layer composed of a silicon carbide oxide and having a thickness of 2.6 nm or less, and a second base material including an element M which is one or more of metal elements (excluding alkali metals and alkaline earth metals), Si, Ge, As, Se, Sb, C in diamond, and C in silicon carbide on at least a part of a lower surface, wherein the upper surface of the first base material and the lower surface of the second base material are bonded together via an intermediate layer.

The method for producing a silicon carbide composite body according to the present invention includes a hydroxylation process in which an oxide of one base material including silicon carbide with the oxide formed on the surface on at least a part of an upper surface is reduced and OH is introduced into the upper surface; and a bonding process in which, while a lower surface of the other base material including a hydroxylate M-OH with an element M which is one or more of metal elements (excluding alkali metals and alkaline earth metals), Si, Ge, As, Se, Sb, C in diamond, and C in silicon carbide on at least a part of the lower surface is brought into contact with the upper surface into which OH has been introduced in the hydroxylation process, dehydration energy is applied to this contact part to cause a dehydration reaction, and the one base material and the other base material are bonded together.

Advantageous Effects of Invention

According to the silicon carbide composite body of the present invention, efficient heat conduction and electrical conduction between bonding base materials can be expected. In addition, according to the method for producing a silicon carbide composite body of the present invention, a silicon carbide composite body that can be expected to have efficient heat conduction and electrical conduction between bonding base materials is easily obtained.

BRIEF DESCRIPTION OF DRAWINGS

FIG. 1 is a schematic view showing a process of producing a silicon carbide composite body of Example 1.

FIG. 3 is a schematic view showing a process of producing a silicon carbide composite body of Example 2.

FIG. 6 is a schematic view showing a process of producing a silicon carbide composite body of Example 3.

FIG. 8 is a schematic view showing a process of producing a silicon carbide composite body of Example 4.

DESCRIPTION OF EMBODIMENTS

Figure 2:
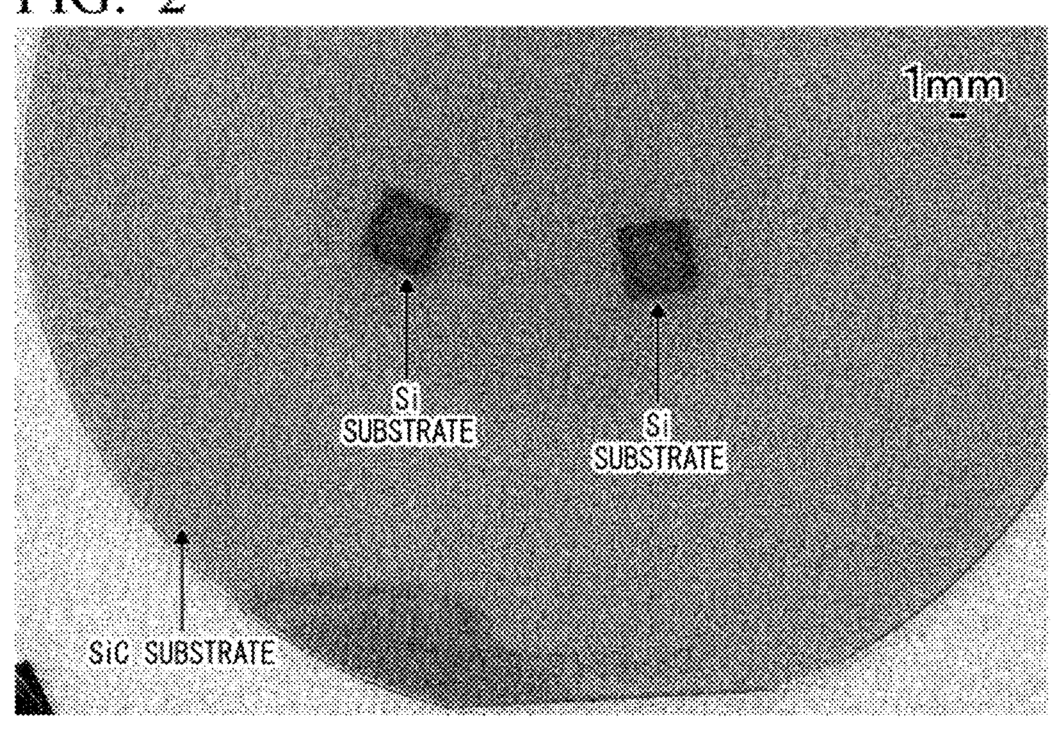
FIG. 2 is a planar image of a silicon carbide composite body obtained in Example 1.

A silicon carbide composite body according to a first embodiment of the present invention includes a first base material and a second base material. Examples of the first base material and the second base material include a substrate having a thin flat plate shape and a solid having a shape thicker than the substrate. The first base material includes silicon carbide on at least a part of the upper surface. The "upper surface" in the present invention is not limited to the upper surface in the vertical direction. That is, any surface of the base material that can be the upper side in the vertical direction as a result of appropriately rotating the base material about an arbitrary rotation axis is the "upper surface" of the base material in the present invention. Therefore, the upper surface of the first base material is simply the surface to be bonded together with the second base material.

The first base material may be composed of silicon carbide or may contain a substance other than silicon carbide as long as at least a part of the upper surface is composed of silicon carbide. In addition, the silicon carbide on the upper surface of the first base material may be silicon carbide from which at least a part of a surface oxide film such as a natural oxide film has been removed. The silicon carbide on the upper surface of the first base material may be a single crystal silicon carbide or a polycrystalline silicon carbide. As will be described below in examples, even when the upper surface of the first base material is composed of a polycrystalline silicon carbide, a silicon carbide composite body can be produced. The cost of the silicon carbide composite body can be reduced using a polycrystalline silicon carbide.

The second base material includes a predetermined element M on at least a part of the lower surface. The "lower surface" in the present invention is not limited to the lower surface in the vertical direction. That is, any surface of the base material that can be the lower side in the vertical direction as a result of appropriately rotating the base material about an arbitrary rotation axis is the "lower surface" of the base material in the present invention. Therefore, the lower surface of the second base material is simply the surface to be bonded together with the first base material.

The predetermined element M is one or more of metal elements (excluding alkali metals and alkaline earth metals), Si, Ge, As, Se, Sb, C in diamond, and C in silicon carbide. The metal elements (excluding alkali metals and alkaline earth metals) are Al, Sc with an atomic number of 21 to Ga with an atomic number of 31, Y with an atomic number of 39 to Sn with an atomic number of 50 and La with an atomic number of 57 to Pb with an atomic number of 82.

The second base material may be composed of diamond or may contain a substance other than diamond as long as at least a part of the lower surface is composed of diamond. In addition, the second base material may be composed of silicon carbide or may contain a substance other than silicon carbide as long as at least a part of the lower surface is composed of silicon carbide. The silicon carbide on the lower surface of the second base material may be silicon carbide from which at least a part of the surface oxide film such as a thermal oxide film or a natural oxide film has been removed.

In addition, the second base material may be composed of one or more elements of metal elements (excluding alkali metals and alkaline earth metals), Si, Ge, As, Se, and Sb, or may be composed of compounds containing these elements, or may contain other substances as long as at least a part of the lower surface contains these elements or a compound containing these elements. Here, even if the lower surface of the second base material is composed of a compound containing these elements, these elements themselves are present in a part of the lower surface. Therefore, when the lower surface of the second base material is composed of a compound containing these elements, it corresponds to "the second base material including these elements on at least a part of the lower surface."

In addition, at least a part of a surface oxide film such as a thermal oxide film or a natural oxide film on the lower surface may be removed to form a "second base material including these elements on at least a part of the lower surface." Examples of second base materials include diamond base materials, Si base materials, SiC base materials, SiN base materials, Ge base materials, GaAs base materials, GaN base materials, InP base materials, Cu base materials, Al base materials, AlN base materials, Ti base materials, TiN base materials, $SiO_2$ base materials, $Ga_2O_3$ base materials, $Al_2O_3$ base materials, CuO base materials, ZnO base materials, $TiO_2$ base materials, $Y_3Al_5O_{12}$ base materials, $LiNbO_3$ base materials, $LiTaO_3$ base materials, and $CH_3NH_3PbI_3$ base materials.

In the silicon carbide composite body according to the first embodiment, when at least some of C in silicon carbide on the upper surface of the first base material and at least some of M on the lower surface of the second base material form C—O-M bonds, the upper surface of the first base material and the lower surface of the second base material are bonded together. In place of this or together with this, when at least some Si in silicon carbide on the upper surface of the first base material and at least some of M on the lower surface of the second base material form Si—O-M bonds, the upper surface of the first base material and the lower surface of the second base material may be bonded together. Formation of C—O-M bonds and Si—O-M bonds can be confirmed by, for example, FT-IR.

Which of C—O-M bonds and Si—O-M bonds are formed depends on the crystal plane of the surface of silicon carbide on the upper surface of the first base material. For example, when the surface of the silicon carbide is the (000-1) plane, C—O-M bonds are formed, and when the surface of the silicon carbide is the (0001) plane, Si—O-M bonds are formed. When the silicon carbide on the upper surface of the first base material has a polycrystalline structure, both C—O-M bonds and Si—O-M bonds are formed. Since the second base material is strongly bonded to the first base material according to C—O-M bonds and/or Si—O-M bonds, heat conduction and electrical conduction are efficiently performed between base materials in the silicon carbide composite body according to the first embodiment.

A silicon carbide composite body according to a second embodiment of the present invention includes a first base material, an intermediate layer, and a second base material. Since the first base material and the second base material in the silicon carbide composite body according to the second embodiment are the same as the first base material and the second base material of the silicon carbide composite body according to the first embodiment, description thereof is omitted. The intermediate layer is composed of a silicon carbide oxide. The silicon carbide oxide is a substance composed of Si, C, and O and having C—Si—O bonds or Si—C—O bonds. In the silicon carbide composite body according to the second embodiment, the upper surface of the first base material and the lower surface of the second base material are bonded together via an intermediate layer.

That is, the intermediate layer functions as an interposing layer that bonds the first base material and the second base material. The thickness of the intermediate layer is 2.6 nm or less. Since the thickness of the intermediate layer is 2.6 nm or less, compared to the silicon-silicon carbide bonded substrate of Non-Patent Document 1 in which a silicon oxide layer with a thickness of about 4 nm to 9 nm is interposed between a silicon substrate and a silicon carbide substrate, the silicon carbide composite body according to the second embodiment has excellent heat conduction and electrical conduction between base materials.

In addition, the thickness of the natural oxide film formed on the surface of the silicon carbide is about 1.3 nm, and the thickness of the natural oxide film formed on the surface of metal elements (excluding alkali metals and alkaline earth metals), Si, Ge, As, Se, and Sb is about 1.3 nm. Therefore, for example, compared to a laminate in which surfaces on which natural oxide films of a silicon carbide base material and a silicon base material are formed are adhered to each other, the silicon carbide composite body according to the second embodiment in which the first base material is a silicon carbide base material, the second base material is a silicon base material, and the thickness of the intermediate layer is 2.6 nm or less has the same or better heat conduction and electrical conduction between base materials.

In addition, compared to a laminate in which two base materials with a natural oxide film formed only on one base material surface, for example, a $Ga_2O_3$ base material and a silicon carbide base material having a natural oxide film formed on the surface are adhered to each other with the natural oxide film therebetween, a silicon carbide composite body according to the second embodiment in which the first base material is a silicon carbide base material, the second base material is a $Ga_2O_3$ base material, and the thickness of the intermediate layer is 1.3 nm or less has the same or better heat conduction and electrical conduction between base materials.

Therefore, the thickness of the intermediate layer is preferably 1.3 nm or less. Here, in order to reduce deterioration of heat conduction and electrical conduction between base materials, a thinner intermediate layer is preferable. In addition, in the silicon carbide composite body according to each embodiment, the shear strength between the first base material and the second base material is preferably 0.1 MPa or more so that the first base material and the second base material can be used without being separated. The shear strength is measured by a die shear test (JEITA ED-4703).

A method for producing a silicon carbide composite body according to an embodiment of the present invention includes a hydroxylation process and a bonding process. In the hydroxylation process, an oxide of one base material is reduced and OH is introduced into the upper surface. The one base material includes silicon carbide with the oxide formed on the surface on at least a part of the upper surface. This oxide may be a natural oxide of silicon carbide. Here, the silicon carbide oxide is a substance composed of Si, C, and O and having C—Si—O bonds or Si—C—O bonds. According to the reduction treatment, for example, C—Si—O and/or Si—C—O become C—Si—OH and/or Si—C—OH. Examples of reduction treatments include a treatment with HF.

In the bonding process, while the lower surface of the other base material including a hydroxylate M-OH with a predetermined element M on at least a part of the lower surface and the upper surface of one base material into which OH has been introduced in the hydroxylation process are brought into contact with each other, dehydration energy is applied to this contact part to cause a dehydration reaction, and one base material and the other base material are bonded to obtain a silicon carbide composite body. Here, the predetermined element M is one or more of metal elements (excluding alkali metals and alkaline earth metals), Si, Ge, As, Se, Sb, C in diamond, and C in silicon carbide.

Examples of methods for introducing OH into M present in the other base material to form M-OH on at least a part of the lower surface include a reduction treatment or oxidation treatment in which the lower surface of the other base material is treated by a treatment with a mixed solution containing $NH_3$ and $H_2O_2$, a mixed solution containing $H_2SO_4$ and $H_2O_2$, or an HF solution or a treatment with oxygen plasma. In the bonding process, the lower surface of the other base material and the upper surface of one base material are brought into contact with each other in the atmosphere. Therefore, the silicon carbide composite body can be easily produced.

Examples of dehydration energy include thermal energy, light energy, electrical energy, and chemical energy. In the present embodiment, the contact part between one base material and the other base material is heated at a temperature of about 200° C. According to this dehydration reaction, C—O-M bonds and/or Si—O-M bonds are formed, and one base material and the other base material are bonded together. This bonding part has sufficient shear strength.

Example 1

FIG. 1 conceptually shows a process of producing a silicon carbide composite body of Example 1. A disk-shaped Si substrate with a diameter of 100 mm, a thickness of 0.4 mm, and surface (100) plane (T4APX commercially available from Matsuzaki Seisakusho Co., Ltd.) (raw material for the second base material) was cut into 5 mm squares. An area of 1 mm toward the center from the uneven cut edge of the Si substrate obtained by cutting was chemically etched and removed using tetramethylammonium hydroxide so that the depth was about 100 μm. The Si substrate was immersed in a mixed solution containing 10 mL of 28% ammonia water, 10 mL of a 35% hydrogen peroxide solution, and 50 mL of pure water at room temperature for 10 minutes. Then, the Si substrate was rinsed with pure water for 5 minutes. OH was introduced into the surface of the Si substrate to form Si—OH.

On the other hand, a disk-shaped SiC substrate with a diameter of 75 mm, a thickness of 0.350 mm and a surface (0001) plane (W4NRE4C-V200, commercially available from Cree Inc.) (raw material for the first base material) was immersed in a mixed solution containing 50 mL of 49% hydrofluoric acid and 150 mL of pure water at room temperature for 5 minutes. Then, the SiC substrate was rinsed with pure water for 5 minutes. As a result, the surface oxide film of the SiC substrate was removed and OH was introduced into the surface to form Si—OH. The surface on the Si—OH side of the Si substrate obtained above and the surface on the Si—OH side of the SiC substrate were brought into contact with each other in the atmosphere, and the substrate was stored in a sealed container together with a drying agent for 3 days. Then, heating was performed at a temperature of 200° C. for 5 hours to cause a dehydration reaction. A silicon carbide composite body in which the SiC substrate and the Si substrate were bonded according to Si—O—Si bonds was obtained.

FIG. 2 is a planar image of the silicon carbide composite body obtained in Example 1 from above, that is, obtained by observing the Si substrate through a transparent SiC substrate. Since an area of 1 mm toward the center from the edge of the Si substrate was chemically removed, it was not bonded to the SiC substrate. On the other hand, it was found that, in a 3 mm square area of the center part of the Si substrate, no Newton ring derived from the non-bonding part was observed, and bonding was favorable. When a shear stress of 6.6 MPa was applied to the Si substrate on the left side in FIG. 2 and a shear stress of 5.1 MPa was applied to the Si substrate on the right side in FIG. 2, in both bases, separation from the inside of the Si substrate and the bonding interface with the SiC substrate occurred. In this manner, a silicon carbide composite body in which the shear strength between the first base material and the second base material was 5 MPa or more was obtained.

Example 2

FIG. 3 conceptually shows a process of producing a silicon carbide composite body of Example 2. A disk-shaped SiC substrate with a diameter of 100 mm, a thickness of 0.350 mm and a surface (000-1) plane (commercially available from II-VI Corporation) (raw materials for the first base material and the second base material) was cut into a rectangular plate with a length of 10 mm and a width of 11 mm. The SiC substrate was immersed in a mixed solution containing 50 mL of 49% hydrofluoric acid and 150 mL of pure water at room temperature for 5 minutes. Then, the SiC substrate was rinsed with pure water for 5 minutes. As a result, the surface oxide film of the SiC substrate was removed and OH was introduced into the surface to form C—OH. The surfaces on the C—OH side of the two SiC substrates obtained were brought into contact with each other in the atmosphere and stored in a sealed container together with a drying agent for 3 days. Then, heating was performed at a temperature of 200° C. for 5 hours to cause a dehydration reaction. A silicon carbide composite body in which the SiC substrate and the SiC substrate were bonded according to C—O—C bonds, that is, two SiC substrates were superimposed and bonded, was obtained.

Figure 4:
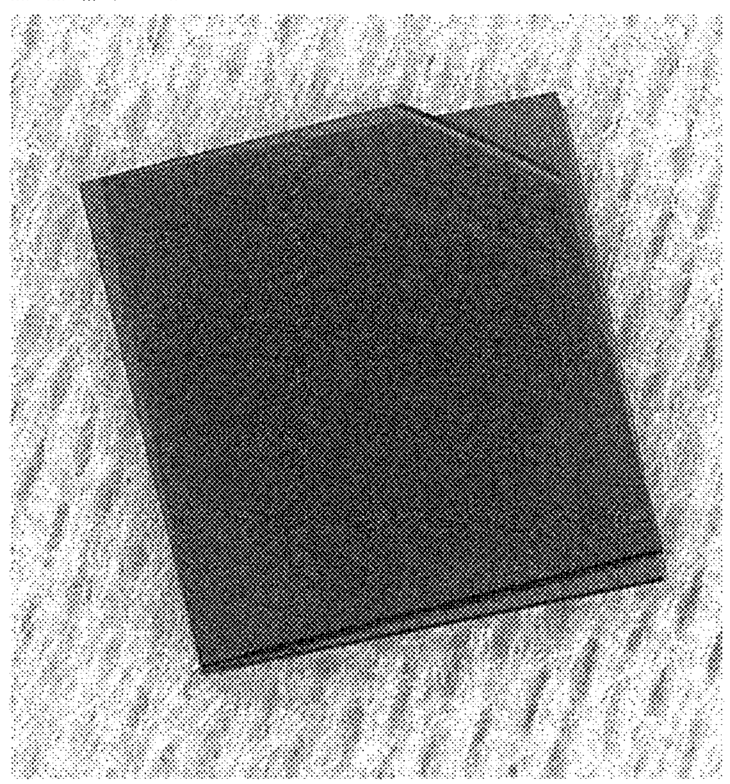
FIG. 4 is a planar image of a silicon carbide composite body obtained in Example 2.
Figure 5:
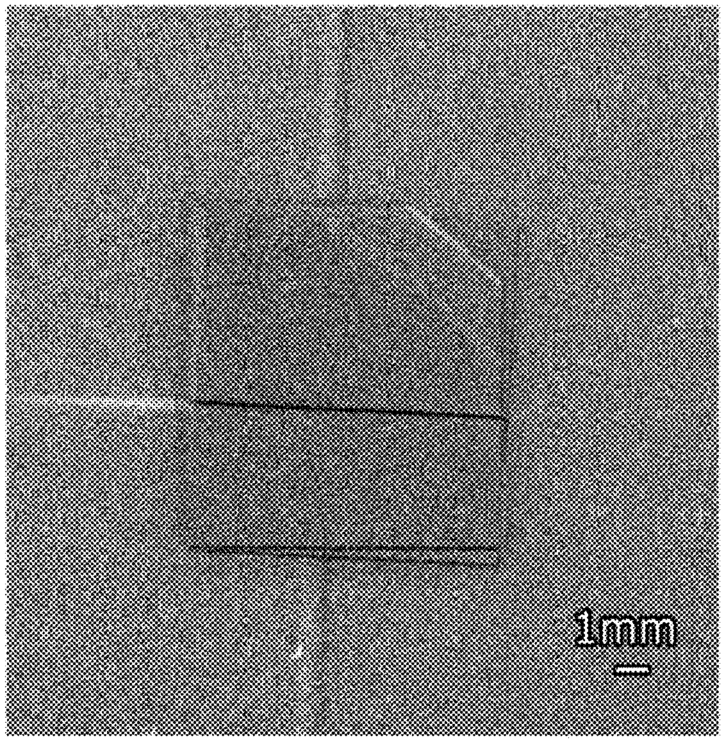
FIG. 5 is a planar image of the silicon carbide composite body obtained in Example 2 of which a center part is cut with a dicing saw from above.

FIG. 4 is a planar image from above the silicon carbide composite body obtained in Example 2. As shown in FIG. 4, the upper right part of the SiC substrate on the upper side of the silicon carbide composite body of Example 2 was missing, and the vicinity of the immediate lower left part of this missing part was bright. It was thought that the two SiC substrates could not be bonded due to the unevenness resulting from cutting of the SiC substrate. On the other hand, the center of the silicon carbide composite body was relatively dark. It was thought that two SiC substrates were bonded together at the center part of the silicon carbide composite body. FIG. 5 shows a planar image of the silicon carbide composite body of which a center part was cut with a dicing saw from above. As shown in FIG. 5, two SiC substrates of the silicon carbide composite body were not separated even through the cutting process.

Example 3

FIG. 6 conceptually shows a process of producing a silicon carbide composite body of Example 3. The surface of a rectangular plate-shaped single crystal $\beta$-$Ga_2O_3$ substrate with a length of 23 mm, a width of 25 mm, and a thickness of 0.4 mm (T010FE2525, commercially available from Novel Crystal Technology, Inc.) (raw material for the second base material) was treated with high-purity oxygen plasma at a pressure of 60 Pa and an output of 200 W for 1 minute. As a result, a $\beta$-$Ga_2O_3$ substrate with Ga-OH formed on the surface was obtained.

On the other hand, a SiC substrate with C—OH formed on the surface was produced in the same manner as in Example 2 except that the substrate was cut into a rectangular plate with a length of 28 mm and a width of 30 mm. The surface on the Ga-OH side of the $\beta$-$Ga_2O_3$ substrate obtained above and the surface on the C—OH side of the SiC substrate were brought into contact with each other in the atmosphere, and stored in a sealed container together with a drying agent for 3 days. Then, heating was performed at a temperature of 200° C. for 12 hours to cause a dehydration reaction. A silicon carbide composite body in which the SiC substrate and the $\beta$-$Ga_2O_3$ substrate were bonded according to C—O—Ga bonds was obtained.

Figure 7:
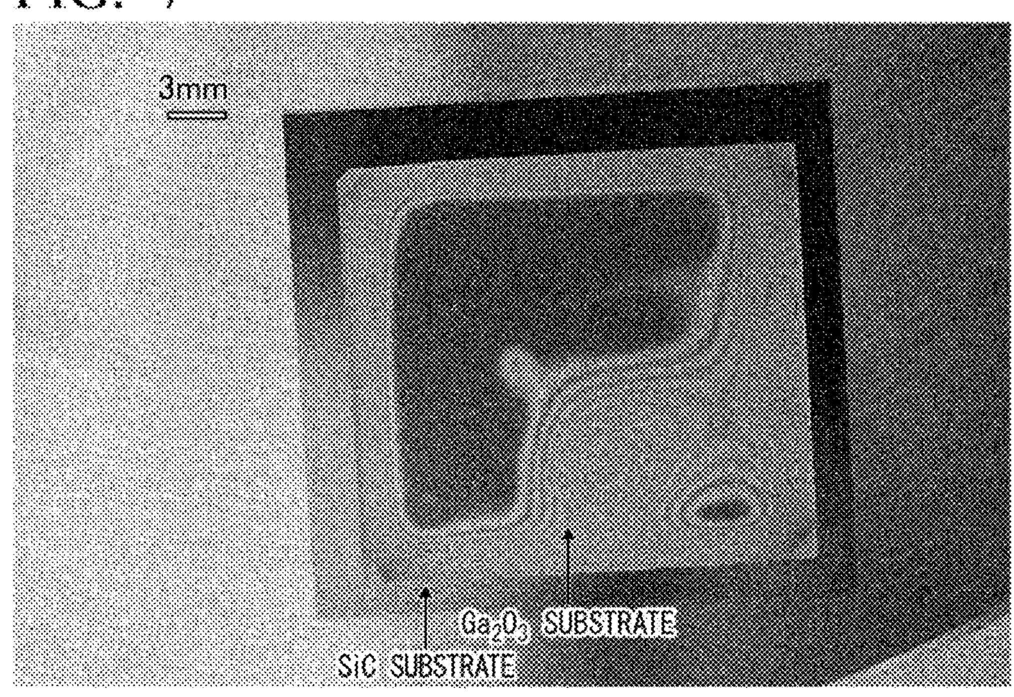
FIG. 7 is a planar image of a silicon carbide composite body obtained in Example 3.

FIG. 7 is a planar image of the silicon carbide composite body obtained in Example 3 from above, that is, obtained by observing the SiC substrate through a transparent $\beta$-$Ga_2O_3$ substrate. As shown in FIG. 7, in the observed Newton ring, in an area of about 2 mm toward the center from the edge of the $\beta$-$Ga_2O_3$ substrate, the $\beta$-$Ga_2O_3$ substrate and the SiC substrate were not bonded. It was thought that this area of the $\beta$-$Ga_2O_3$ substrate had a convex surface and could not be adhered to the SiC substrate. In addition, at the lower center of the $\beta$-$Ga_2O_3$ substrate, a foreign substance was interposed between the $\beta$-$Ga_2O_3$ substrate and the SiC substrate, and thus bonding was not possible. On the other hand, in an area in which no Newton ring was observed, the $\beta$-$Ga_2O_3$ substrate and the SiC substrate were bonded together.

Example 4

FIG. 8 conceptually shows a process of producing a silicon carbide composite body of Example 4. The surface of a rectangular plate-shaped $\beta$-$Ga_2O_3$ thin plate with a length of 20 mm, a width of 15 mm, and a thickness of 1 mm (raw material for the second base material) produced from a single crystal $\beta$-$Ga_2O_3$ substrate (NvD-1906-029, commercially available from Novel Crystal Technology, Inc.) by a cleavage method was treated with high-purity oxygen plasma at a pressure of 60 Pa and an output of 200 W for 1 minute. As a result, a $\beta$-$Ga_2O_3$ thin plate with Ga-OH formed on the surface was obtained.

On the other hand, a SiC substrate with C—OH formed on the surface was produced in the same manner as in Example 3. The surface on the Ga-OH side of the $\beta$-$Ga_2O_3$ thin plate obtained above and the surface on the C—OH side of the SiC substrate were brought into contact with each other in the atmosphere and stored in a sealed container together with a drying agent for 3 days. Then, heating was performed at a temperature of 250° C. for 24 hours to cause a dehydration reaction. A silicon carbide composite body in which the SiC substrate and the $\beta$-$Ga_2O_3$ thin plate were bonded together according to C—O—Ga bonds was obtained.

Figure 9:
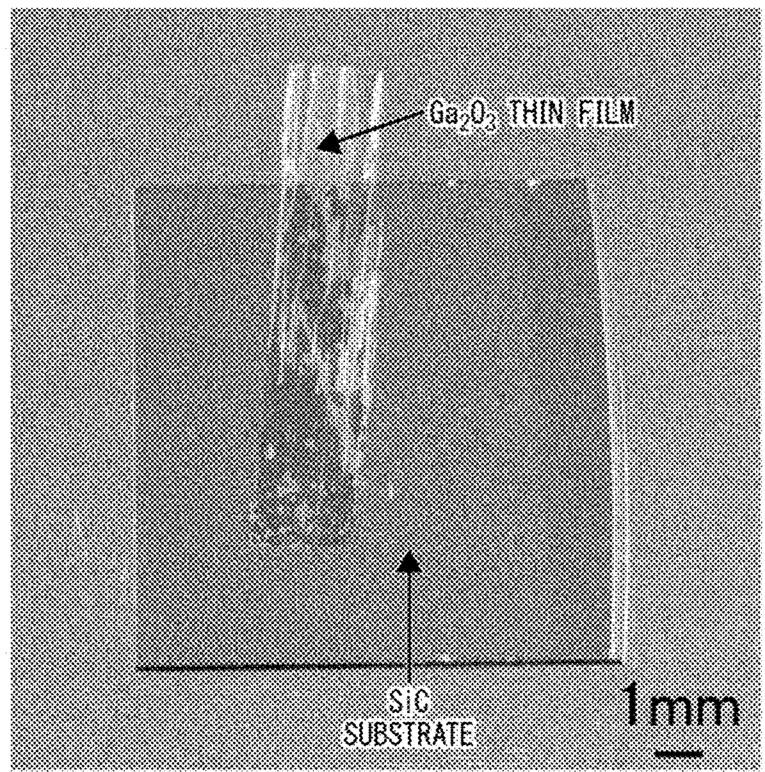
FIG. 9 is a planar image of a silicon carbide composite body obtained in Example 4.

FIG. 9 is a planar image of the silicon carbide composite body obtained in Example 4 from above, that is, obtained by observing the SiC substrate through a transparent $\beta$-$Ga_2O_3$ thin plate. In an area in which the $\beta$-$Ga_2O_3$ thin plate and the SiC substrate could not be bonded, white bubbles present at the interface between the $\beta$-$Ga_2O_3$ thin plate and the SiC substrate were observed. These white bubbles were thought to be caused by surface contamination of the $\beta$-$Ga_2O_3$ thin plate or crystal cleavage. On the other hand, in an area in which no bubbles were observed, the $\beta$-$Ga_2O_3$ thin plate and the SiC substrate were bonded.

Figure 10:
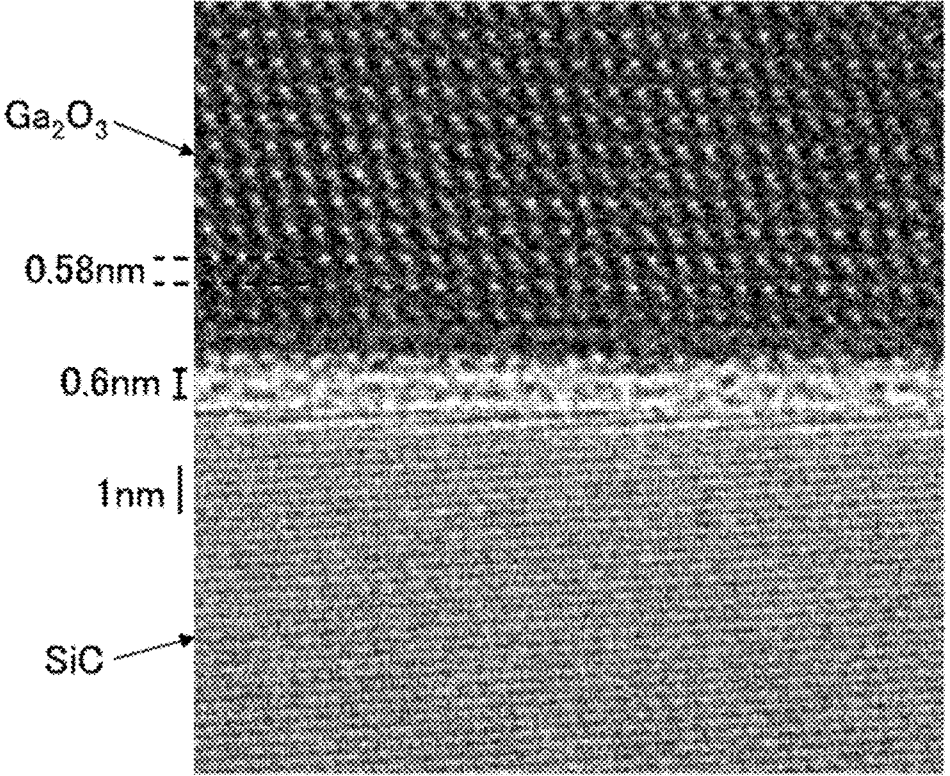
FIG. 10 is a transmission electron microscope image of an interface of the silicon carbide composite body obtained in Example 4.

FIG. 10 shows a transmission electron microscope image of the interface of the silicon carbide composite body obtained in Example 4. An intermediate layer of about 0.6 nm was observed at the bonding interface between the $\beta$-$Ga_2O_3$ thin plate and the SiC substrate. In the silicon-silicon carbide bonded substrate of Non-Patent Document 1, between the silicon substrate and the silicon carbide substrate of which the surface was oxidized, an amorphous layer composed of S, O, and C and having a thickness of about 4 nm to 9 nm was observed. However, as in this example, when the oxide formed on the surface of the silicon carbide was reduced, the thickness of the intermediate layer at the bonding interface of the base material could be reduced to about 0.6 nm to 1.3 nm, which is the thickness of the surface oxide film of silicon carbide. Therefore, in the silicon carbide composite body of the present invention, effective heat conduction and electrical conduction via the bonding interface can be expected.

Figure 11:
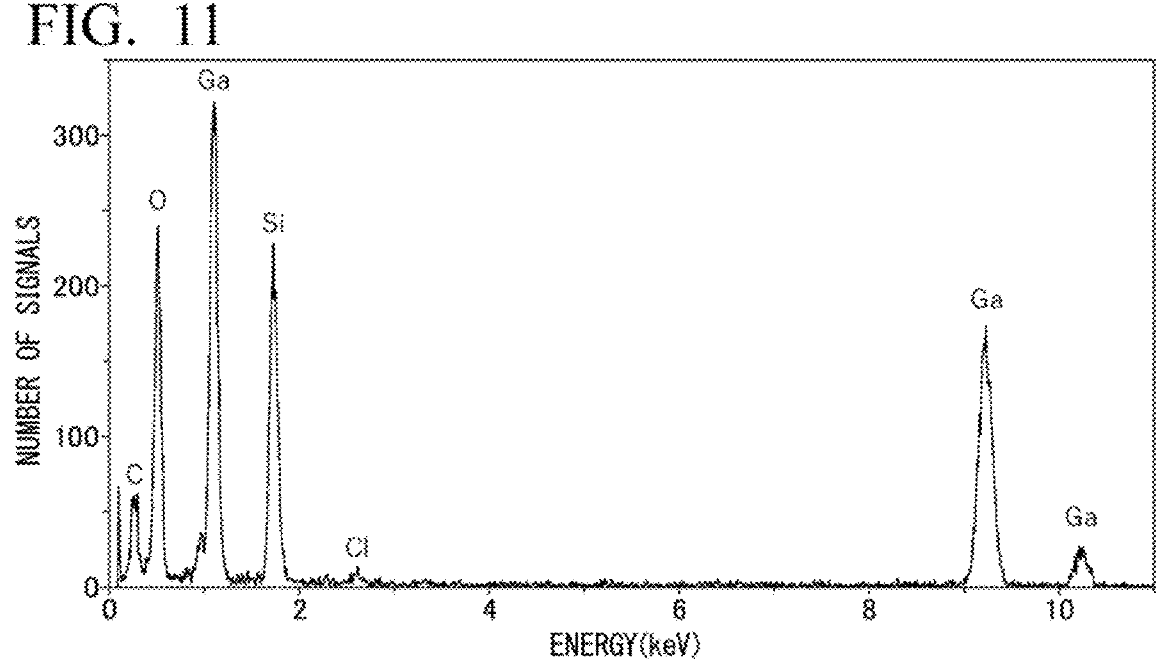
FIG. 11 shows energy dispersive X-ray spectroscopy spectrums of an interface of the silicon carbide composite body obtained in Example 4.

Here, it was thought that the thickness of the intermediate layer at the bonding interface of the base material could be as small as 0.3 nm, which is the bond length of Si—O-M such as Si—O—Si and Si—O—C. FIG. 11 shows energy dispersive X-ray spectroscopy spectrums of the interface of the silicon carbide composite body obtained in Example 4. From the bonding interface of the silicon carbide composite body, Ga derived from the $\beta$-$Ga_2O_3$ thin plate and O, and Si derived from the SiC substrate and C were mainly detected. In addition, a small amount of Cl was detected. It was thought that Cl was derived from the contamination of the surface of the silicon carbide composite body.

Example 5

Figure 12:
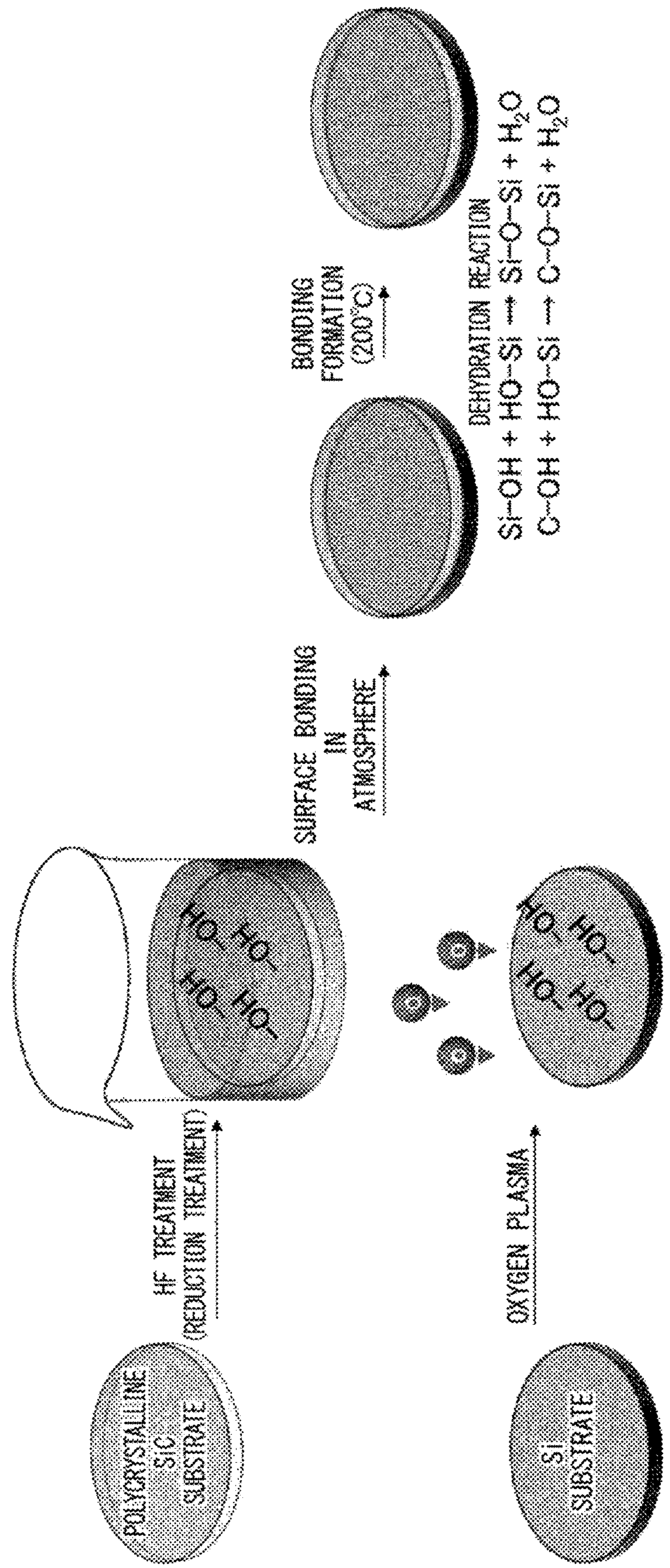
FIG. 12 is a schematic view showing a process of producing a silicon carbide composite body of Example 5.

FIG. 12 conceptually shows a process of producing a silicon carbide composite body of Example 5. The surface of the disk-shaped Si substrate (raw material for the second base material) used in Example 1 was treated with high-purity oxygen plasma at a pressure of 60 Pa and an output of 200 W for 1 minute. As a result, a Si substrate with Si—OH formed on the surface was obtained. On the other hand, a disk-shaped polycrystalline SiC substrate with a diameter of 100 mm and a thickness of 0.7 mm (commercially available from Tokai Fine Carbon Co., Ltd.) (raw material for the first base material) was immersed in a mixed solution containing 50 mL of 49% hydrofluoric acid and 150 mL of pure water at room temperature for 5 minutes. Then, the polycrystalline SiC substrate was rinsed with pure water for 5 minutes. As a result, OH was introduced into the surface of the polycrystalline SiC substrate, and C—OH and Si—OH were formed.

Figure 13:
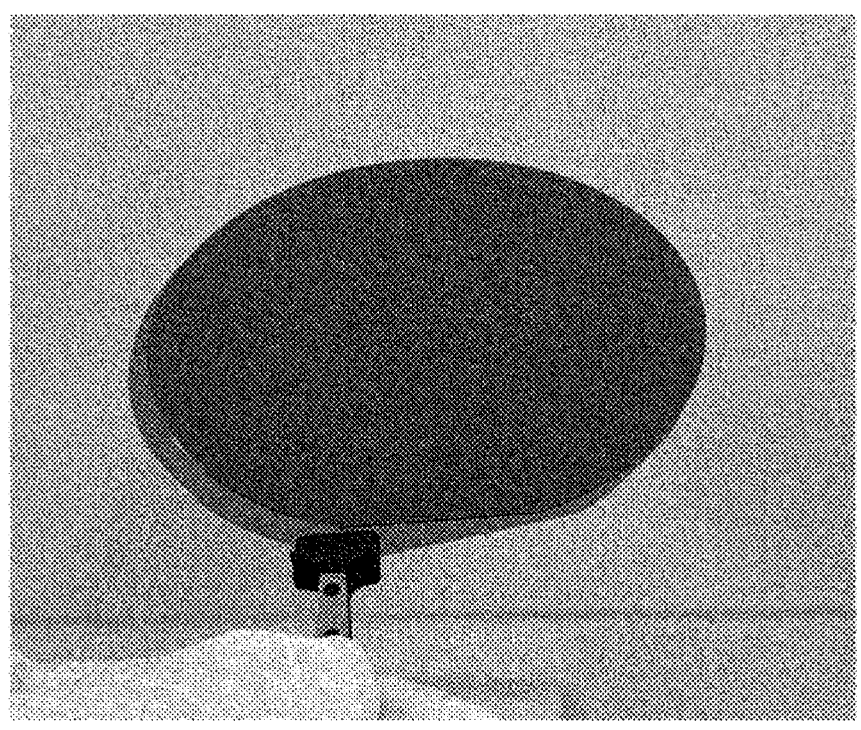
FIG. 13 is an image of the silicon carbide composite body obtained in Example from obliquely above.
Figure 14:
FIG. 14 is an ultrasound microscope image of an interface of the silicon carbide composite body obtained in Example 5.

The surface on the Si—OH side of the Si substrate obtained above and the surface on the C—OH and Si—OH side of the polycrystalline SiC substrate were brought into contact with each other in the atmosphere and stored in a sealed container together with a drying agent for 3 days. Then, heating was performed at a temperature of 200° C. for 5 hours to cause a dehydration reaction. A silicon carbide composite body in which the polycrystalline SiC substrate and the Si substrate were bonded according to C—O—Si bonds and Si—O—Si bonds was obtained. FIG. 13 is an image of the silicon carbide composite body obtained in Example 5 from obliquely above. As shown in FIG. 13, in the silicon carbide composite body, it was confirmed that the polycrystalline SiC substrate and the Si substrate were bonded together. FIG. 14 is an ultrasound microscope image of the silicon carbide composite body obtained in Example 5. Parts that could not be bonded appeared bright. As shown in FIG. 14, in the silicon carbide composite body, although parts that could not be bonded due to surface deposits appeared, it was confirmed that about 95% of the entire body was bonded.

The invention claimed is:

1. A silicon carbide composite body, comprising:

a first base material including a single crystal silicon carbide or a polycrystalline silicon carbide on at least a part of an upper surface; and a second base material including an element M which is one or more of metal elements (excluding alkali metals and alkaline earth metals), Si, Ge, As, Se, Sb, C in diamond, and C in silicon carbide on at least a part of a lower surface, wherein the bonding interface between the upper surface of the first base material, which is the (000-1) plane of the single crystal silicon carbide, and the lower surface of the second base material includes C—O-M bondings between at least some of C of the (000-1) plane of the single crystal silicon carbide on the upper surface of the first base material and at least some of M on the lower surface of the second base material.

2. The silicon carbide composite body according to claim 1, wherein the shear strength between the first base material and the second base material is 0.1 MPa or more.

3. A silicon carbide composite body, comprising:

a first base material including a single crystal silicon carbide or a polycrystalline silicon carbide on at least a part of an upper surface; and a second base material including an element M which is one or more of metal elements (excluding alkali metals and alkaline earth metals), Si, Ge, As, Se, Sb, C in diamond, and C in silicon carbide on at least a part of a lower surface, wherein the bonding interface between the upper surface of the first base material, which is the (0001) plane of the single crystal silicon carbide, and the lower surface of the second base material includes Si—O-M bondings between at least some of Si of the (0001) plane of the single crystal silicon carbide on the upper surface of the first base material and at least some of M on the lower surface of the second base material.

4. The silicon carbide composite body according to claim 3, wherein the shear strength between the first base material and the second base material is 0.1 MPa or more.

5. A silicon carbide composite body, comprising:

a first base material including a single crystal silicon carbide or a polycrystalline silicon carbide on at least a part of an upper surface;

an intermediate layer composed of a silicon carbide oxide and having a thickness of 2.6 nm or less;

a second base material including an element M which is one or more of metal elements (excluding alkali metals and alkaline earth metals), Si, Ge, As, Se, Sb, C in diamond, and C in silicon carbide on at least a part of a lower surface, wherein the upper surface of the first base material and the lower surface of the second base material are bonded via the intermediate layer, and the intermediate layer includes C—O-M bondings between at least some of C of the (000-1) plane of the single crystal silicon carbide on the upper surface of the first base material and at least some of M on the lower surface of the second base material or Si—O-M bondings between at least some of Si of the (0001) plane of the single crystal silicon carbide on the upper surface of the first base material and at least some of M on the lower surface of the second base material.

6. The silicon carbide composite body according to claim 5, wherein the thickness of the intermediate layer is 1.3 nm or less.

7. The silicon carbide composite body according to claim 6, wherein the thickness of the intermediate layer is 0.6 nm or more.

8. The silicon carbide composite body according to claim 6, wherein the silicon carbide on the upper surface of the first base material is a polycrystalline silicon carbide.

9. The silicon carbide composite body according to claim 6, wherein the shear strength between the first base material and the second base material is 0.1 MPa or more.

10. The silicon carbide composite body according to claim 5, wherein the thickness of the intermediate layer is 0.6 nm or more.

11. The silicon carbide composite body according to claim 10, wherein the silicon carbide on the upper surface of the first base material is a polycrystalline silicon carbide.

12. The silicon carbide composite body according to claim 10, wherein the shear strength between the first base material and the second base material is 0.1 MPa or more.

13. The silicon carbide composite body according to claim 5, wherein the silicon carbide on the upper surface of the first base material is a polycrystalline silicon carbide.

14. The silicon carbide composite body according to claim 13, wherein the shear strength between the first base material and the second base material is 0.1 MPa or more.

15. The silicon carbide composite body according to claim 5, wherein the shear strength between the first base material and the second base material is 0.1 MPa or more.

* * * * *